United States Patent
Tremblay et al.

(10) Patent No.: US 6,343,348 B1
(45) Date of Patent: Jan. 29, 2002

(54) APPARATUS AND METHOD FOR OPTIMIZING DIE UTILIZATION AND SPEED PERFORMANCE BY REGISTER FILE SPLITTING

(75) Inventors: Marc Tremblay, Menlo Park, CA (US); William Joy, Aspen, CO (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

(21) Appl. No.: 09/204,481

(22) Filed: Dec. 3, 1998

(51) Int. Cl.$^7$ ............................................... G06F 12/08
(52) U.S. Cl. ..................... 711/149; 711/131; 365/230.05
(58) Field of Search ................................ 711/131, 149; 365/230.05

(56) References Cited

U.S. PATENT DOCUMENTS

| | | | |
|---|---|---|---|
| 5,111,431 A | * 5/1992 | Garde | 365/129.02 |
| 5,642,325 A | 6/1997 | Ang | 365/230.05 |
| 5,657,291 A | * 8/1997 | Podlesny et al. | 365/230.05 |
| 5,713,039 A | * 1/1998 | Tran | 712/23 |
| 5,721,868 A | 2/1998 | Yung et al. | |
| 5,742,557 A | * 4/1998 | Gibbins et al. | 365/230.05 |
| 5,761,475 A | 6/1998 | Yung et al. | |
| 5,764,943 A | 7/1998 | Wechsler | |
| 5,778,248 A | 7/1998 | Leung | |
| 5,822,341 A | 10/1998 | Winterrowd et al. | 371/43.7 |
| 5,946,262 A | * 8/1999 | Randolph et al. | 365/230.05 |
| 5,959,931 A | * 9/1999 | Ueda | 365/230.05 |
| 5,982,699 A | * 11/1999 | Dilbeck | 365/230.05 |
| 6,078,544 A | * 6/2000 | Park | 365/230.05 |
| 6,122,218 A | * 9/2000 | Kang | 365/230.05 |
| 6,144,609 A | * 11/2000 | Lattimore et al. | 365/230.05 |

FOREIGN PATENT DOCUMENTS

| | | |
|---|---|---|
| EP | 0 520 425 | 12/1992 |
| EP | 0 520 788 | 12/1992 |

\* cited by examiner

*Primary Examiner*—Reba I. Elmore
(74) *Attorney, Agent, or Firm*—Skjerven Morrill MacPherson LLP; Ken J. Koestner

(57) ABSTRACT

A multi-ported register file is typically metal limited to the area consumed by the circuit proportional with the square of the number of ports. A processor having a register file structure divided into a plurality of separate and independent register files forms a layout structure with an improved layout efficiency. The read ports of the total register file structure are allocated among the separate and individual register files. Each of the separate and individual register files has write ports that correspond to the total number of write ports in the total register file structure. Writes are fully broadcast so that all of the separate and individual register files are coherent.

31 Claims, 6 Drawing Sheets

APPARATUS AND METHOD FOR OPTIMIZING DIE UTILIZATION AND SPEED PERFORMANCE BY REGISTER FILE SPLITTING

CROSS-REFERENCE

The present invention is related to subject matter disclosed in the following patent applications:

1. U.S. patent application Ser. No. 09/204,480 entitled, "A Multiple-Thread Processor for Threaded Software Applications", naming Marc Tremblay and William Joy as inventors and filed on even date herewith;
2. U.S. patent application Ser. No. 09/204,584 entitled, "Clustered Architecture in a VLIW Processor", naming Marc Tremblay and William Joy as inventors and filed on even date herewith;
3. U.S. patent application Ser. No. 09/204,536 entitled, "Variable Issue-Width VLIW Processor", naming Marc Tremblay as inventor and filed on even date herewith;
4. U.S. patent application Ser. No. 09/204,586 entitled, "Efficient Handling of a Large Register File for Context Switching", naming Marc Tremblay and William Joy as inventors and filed on even date herewith;
5. U.S. patent application Ser. No. 09/205,121 entitled, "Dual In-line Buffers for an Instruction Fetch Unit", naming Marc Tremblay and Graham Murphy as inventors and filed on even date herewith;
6. U.S. patent application Ser. No. 09/204,781 entitled, "An Instruction Fetch Unit Aligner", naming Marc Tremblay and Graham Murphy as inventors and filed on even date herewith;
7. U.S. patent application Ser. No. 09/204,535 entitled, "Local Stall Control Method and Structure in a Microprocessor", naming Marc Tremblay and Sharada Yeluri as inventors and filed on even data herewith;
8. U.S. patent application Ser. No. 09/204,585 entitled, "Local and Global Register Partitioning in a VLIW Processor", naming Marc Tremblay and William Joy as inventors and filed on even data herewith; and
9. U.S. patent application Ser. No. 09/204,479 entitled, "Implicitly Derived Register Specifiers in a Processor", naming Marc Tremblay and William Joy as inventors and filed on even data herewith.

BACKGROUND OF THE INVENTION

1. Field of the Invention

The present invention relates to storage or memory in a processor. More specifically, the present invention relates to a multiple-port storage array.

2. Description of the Related Art

A processor includes storage or memory to store program data and instructions. The memory storage includes cells for storing information and lines for accessing the cells according to defined address locations. Typically the information is arranged in words that contain a plurality of cells. The cells in a word are connected by word lines. The cells in a plurality of words that are located at corresponding positions in the words are connected by bit lines.

A particular address in the memory is accessed by applying address signals to decoding circuitry called an address port. The address port sends an address select signal to a word line at the selected location in the memory array. When the address select signal matches the address of a word memory, data is transferred from or to the individual memory cells at the specified address. Data of each cell is transferred on the associated bit line.

For arrays having more than one address port, called multi-port arrays, more than one address may be decoded and more than one data transfer made during a single read/write cycle. A multi-port memory array has several common bit lines for each memory cell in the array. A register file is one type of memory array.

A word line is associated with each address in a memory array or each register in a register file. A separate word line is used at each address to control each of the separate read bit lines and each of the separate write bit lines. Each of the separate word lines is connected to an address port. Since for every cell in an array the number of bit lines may be equal to the number of word lines or an integer multiplier of the number of word lines and the number of word lines for each address is equal to the number of ports in the array, the size of the multi-port memory array increases as a square of the number of ports to the array.

During operation of the storage, an address is applied to a port and decoded, forming an address signal that is sent via the word line associated with the port to the decoded address location. The address signal on the word line causes the contents of the memory cells at the selected address to be written if the address is applied to a write port or read if the address is applied to a read port. Data is transferred to or from the memory cell via write bit lines and read bit lines, respectively. Each of the read bit lines and write bit lines is associated with a separate word line (port). During a single read/write cycle, the processor performs a plurality of read operations up to the total number of read ports and a plurality of write operations up to the total number of write ports. In a single read/write cycle, the read addresses and write addresses may be different or the same.

Because more than one read operation may be made from a particular memory address during one read/write cycle, the maximum amount of current applied to the memory cell is determined by the number of read ports in the array.

Each memory cell is associated with a word line, a bit line, and pass transistors, resulting in a size or pitch of the memory array that is relatively large. The pitch size of the individual cells corresponds to a large overall size of the memory array and usage of a large percentage of the area on an integrated circuit die. The large area of the circuit results in a reduced manufacturing yield and increased fabrication cost of the circuit. The relatively large size of the memory array lengthens the average access time of data in the memory array in several aspects. First, a larger overall size in a memory array results in longer word lines and bit lines, lengthening the time for a signal to pass along the line. Second, the pass transistors, word line, and bit line associated with a cell increase the capacitive loading on the cell, reducing the capability of the finite charge stored in each cell to drive a selected differential bit line pair. These difficulties are magnified with an increase in scalarity of the integrated circuit.

The evolution of microprocessor and processor integrated circuits trends toward aspects of greater scalarity, reduced cycle times, larger register files, and larger word widths. Storages and memories, such as a register file, a static random access memory (SRAM) array with complex read/write circuitry, a relatively large size, and relatively slow access speeds, is a substantial barrier to performance improvements relating to each of these aspects. Many consider the SRAM memory array to be a design impediment that in the next generation of processors may discourage or even prevent further advancements in scalarity, an increase in word size, an increase in the size of the register file, and/or a reduction of cycle time. Accordingly, an improved register file structure and operating method is needed.

SUMMARY OF THE INVENTION

A multi-ported register file is typically metal limited to the area consumed by the circuit proportional with the square of the number of ports. It has been discovered that a processor having a register file structure divided into a plurality of separate and independent register files forms a layout structure with an improved layout efficiency. The read ports of the total register file structure are allocated among the separate and individual register files. Each of the separate and individual register files has write ports that correspond to the total number of write ports in the total register file structure. Writes are fully broadcast so that all of the separate and individual register files are coherent.

For example, a 16-port register file structure with twelve read ports and four write ports is split into four separate and individual 7-port register files, each with three read ports and four write ports. The area of a single 16-port register file would have a size proportional to 16 times 16 or 256. Each of the separate and individual register files has a size proportional to 7 times 7 or 49 for a total of 4 times 49 or 196. The capacity of a single 16-port register and the four 7-port registers is identical with the split register file structure advantageously having a significantly reduced area. The reduced area advantageously corresponds to an improvement in access time of a register file and thus speed performance due to a reduction in the length of word lines and bit lines connecting the array cells that reduces the time for a signal to pass on the lines. The improvement in speed performance is highly advantageous due to strict time budgets that are imposed by the specification of high-performance processors and also to attain a large capacity register file that is operational at high speed.

An another example, a 17-port register file structure includes twelve read ports and five write ports. Each of the separate and individual register files has 5 write ports. The area of a single 17-port register file would have a size proportional to 17 times 17 or 289. Each of the separate and individual register files has a size proportional to 8 times 8 or 64 for a total of 4 times 64 or 256.

In accordance with an embodiment of the present invention, a storage array structure for a processor having R read ports and W write ports includes a plurality of storage array storages. The storage array storages have a reduced number of read ports allocated from the R read ports so that the total number of read ports for the plurality of storage array storages is R. The storage array storages each have W write ports.

In accordance with an embodiment of the present invention, a register file structure for a processor having R read ports and W write ports includes a plurality of register file storages. The register file storages have a reduced number of read ports allocated from the R read ports so that the total number of read ports for the plurality of register file storages is R. The register file storages each have W write ports.

In accordance with another embodiment of the present invention, a processor includes an instruction supplying circuit and a plurality of functional units. The processor includes a register file structure coupled to the instruction supplying circuit and coupled to the plurality of functional units. The register file structure has R read ports and W write ports and includes a plurality of register file storages. The register file storages have a reduced number of read ports allocated from the R read ports so that the total number of read ports for the plurality of register file storages is R. The register file storages each have W write ports.

BRIEF DESCRIPTION OF THE DRAWINGS

The features of the described embodiments are specifically set forth in the appended claims. However, embodiments of the invention relating to both structure and method of operation, may best be understood by referring to the following description and accompanying drawings.

The use of the same reference symbols in different drawings indicates similar or identical items.

DESCRIPTION OF THE EMBODIMENT(S)

Figure 1:
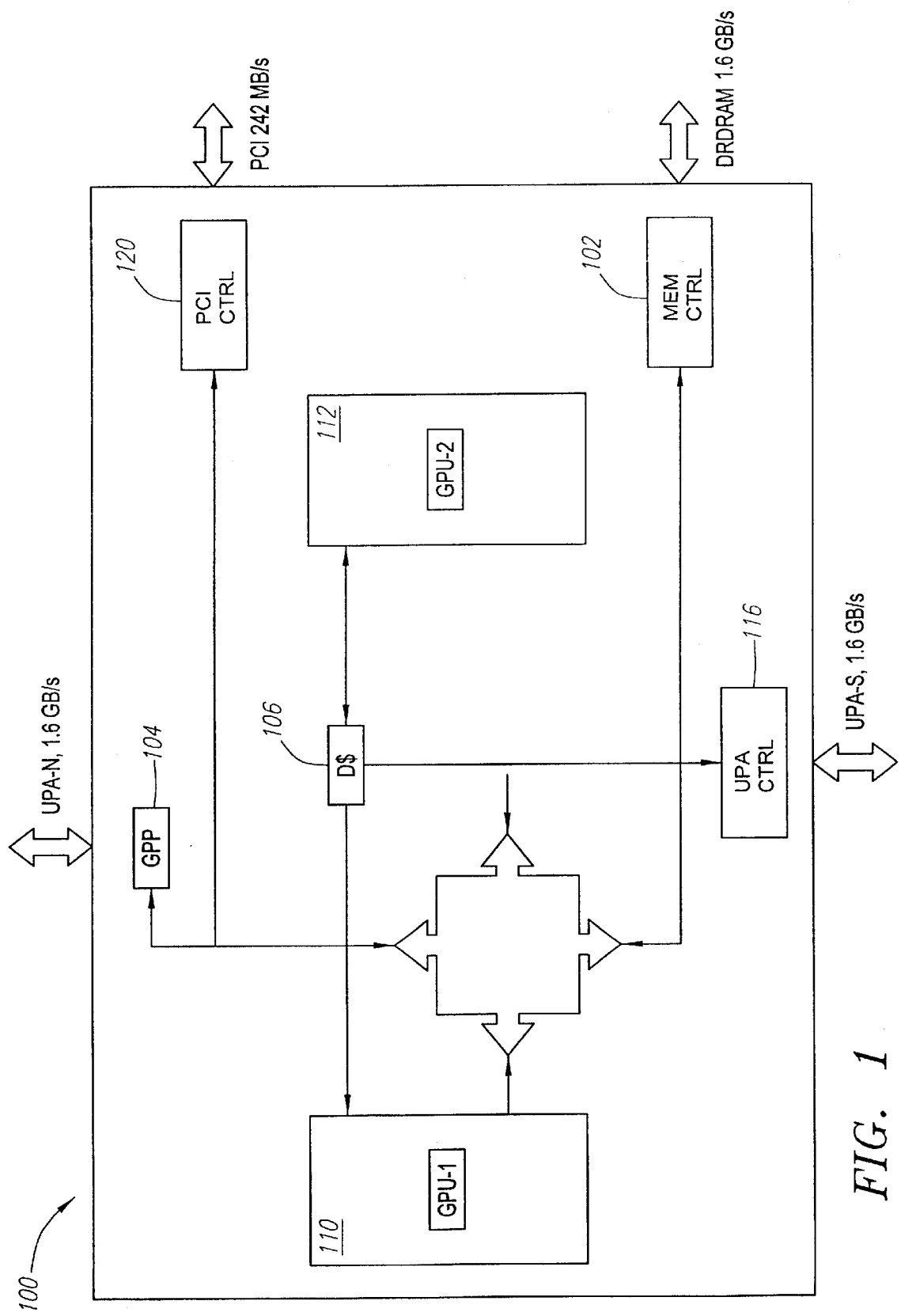
FIG. 1 is a schematic block diagram illustrating a single integrated circuit chip implementation of a processor in accordance with an embodiment of the present invention.

Referring to FIG. 1, a schematic block diagram illustrates a single integrated circuit chip implementation of a processor 100 that includes a memory interface 102, a geometry decompressor 104, two media processing units 110 and 112, a shared data cache 106, and several interface controllers. The interface controllers support an interactive graphics environment with real-time constraints by integrating fundamental components of memory, graphics, and input/output bridge functionality on a single die. The components are mutually linked and closely linked to the processor core with high bandwidth, low-latency communication channels to manage multiple high-bandwidth data streams efficiently and with a low response time. The interface controllers include a an UltraPort Architecture Interconnect (UPA) controller 116 and a peripheral component interconnect (PCI) controller 120. The illustrative memory interface 102 is a direct Rambus dynamic RAM (DRDRAM) controller. The shared data cache 106 is a dual-ported storage that is shared among the media processing units 110 and 112 with one port allocated to each media processing unit. The data cache 106 is four-way set associative, follows a write-back protocol, and supports hits in the fill buffer (not shown). The data cache 106 allows fast data sharing and eliminates the need for a complex, error-prone cache coherency protocol between the media processing units 110 and 112.

The UPA controller 116 is a custom interface that attains a suitable balance between high-performance computational and graphic subsystems. The UPA is a cache-coherent, processor-memory interconnect. The UPA attains several advantageous characteristics including a scaleable bandwidth through support of multiple bused interconnects for data and addresses, packets that are switched for improved bus utilization, higher bandwidth, and precise interrupt processing. The UPA performs low latency memory accesses with high throughput paths to memory. The UPA includes a buffered cross-bar memory interface for increased bandwidth and improved scaleability. The UPA supports high-performance graphics with two-cycle single-word writes on the 64-bit UPA interconnect. The UPA interconnect architecture utilizes point-to-point packet switched messages from a centralized system controller to maintain cache coherence. Packet switching improves bus bandwidth utilization by removing the latencies commonly associated with transaction-based designs.

The PCI controller 120 is used as the primary system I/O interface for connecting standard, high-volume, low-cost peripheral devices, although other standard interfaces may also be used. The PCI bus effectively transfers data among high bandwidth peripherals and low bandwidth peripherals, such as CD-ROM players, DVD players, and digital cameras.

Two media processing units 110 and 112 are included in a single integrated circuit chip to support an execution environment exploiting thread level parallelism in which two independent threads can execute simultaneously. The threads may arise from any sources such as the same application, different applications, the operating system, or the runtime environment. Parallelism is exploited at the thread level since parallelism is rare beyond four, or even two, instructions per cycle in general purpose code. For example, the illustrative processor 100 is an eight-wide machine with eight execution units for executing instructions. A typical "general-purpose" processing code has an instruction level parallelism of about two so that, on average, most (about six) of the eight execution units would be idle at any time. The illustrative processor 100 employs thread level parallelism and operates on two independent threads, possibly attaining twice the performance of a processor having the same resources and clock rate but utilizing traditional non-thread parallelism.

Thread level parallelism is particularly useful for Java™ applications which are bound to have multiple threads of execution. Java™ methods including "suspend", "resume", "sleep", and the like include effective support for threaded program code. In addition, Java™ class libraries are thread-safe to promote parallelism. (Java™, Sun, Sun Microsystems and the Sun Logo are trademarks or registered trademarks of Sun Microsystems, Inc. in the U.S. and other countries. All SPARC trademarks, including UltraSPARC I and UltraSPARC II, are used under license and are trademarks of SPARC International, Inc. in the United States and other countries. Products bearing SPARC trademarks are based upon an architecture developed by Sun Microsystems, Inc.) Furthermore, the thread model of the processor 100 supports a dynamic compiler which runs as a separate thread using one media processing unit 110 while the second media processing unit 112 is used by the current application. In the illustrative system, the compiler applies optimizations based on "on-the-fly" profile feedback information while dynamically modifying the executing code to improve execution on each subsequent run. For example, a "garbage collector" may be executed on a first media processing unit 110, copying objects or gathering pointer information, while the application is executing on the other media processing unit 112.

Although the processor 100 shown in FIG. 1 includes two processing units on an integrated circuit chip, the architecture is highly scaleable so that one to several closely-coupled processors may be formed in a message-based coherent architecture and resident on the same die to process multiple threads of execution. Thus, in the processor 100, a limitation on the number of processors formed on a single die thus arises from capacity constraints of integrated circuit technology rather than from architectural constraints relating to the interactions and interconnections between processors.

Figure 2:
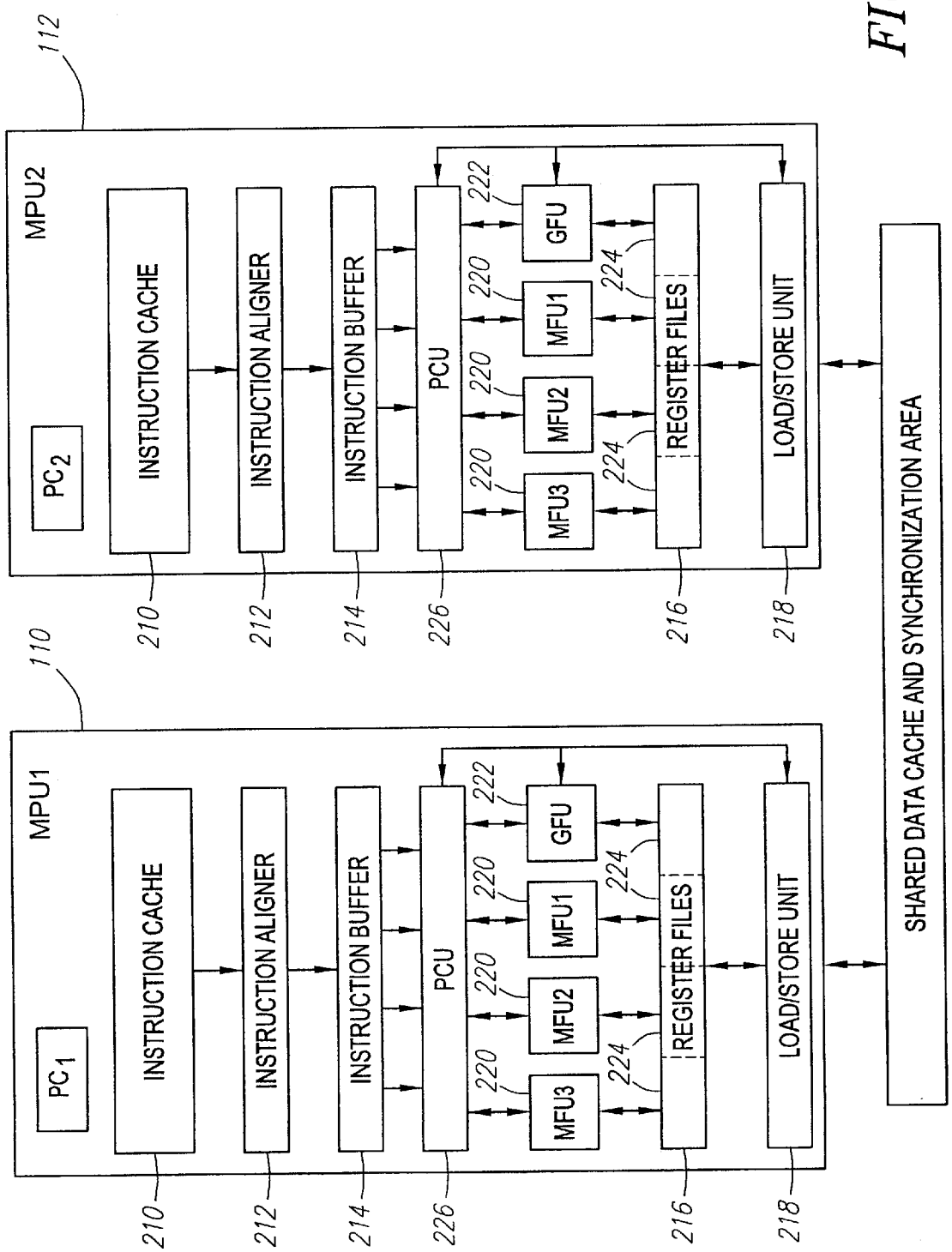
FIG. 2 is a schematic block diagram showing the core of the processor.

Referring to FIG. 2, a schematic block diagram shows the core of the processor 100. The media processing units 110 and 112 each include an instruction cache 210, an instruction aligner 212, an instruction buffer 214, a pipeline control unit 226, a split register file 216, a plurality of execution units, and a load/store unit 218. In the illustrative processor 100, the media processing units 110 and 112 use a plurality of execution units for executing instructions. The execution units for a media processing unit 110 include three media functional units (MFU) 220 and one general functional unit (GFU) 222. The media functional units 220 are multiple single-instruction-multiple-datapath (MSIMD) media functional units. Each of the media functional units 220 is capable of processing parallel 16-bit components. Various parallel 16-bit operations supply the single-instruction-multiple-datapath capability for the processor 100 including add, multiply-add, shift, compare, and the like. The media functional units 220 operate in combination as tightly-coupled digital signal processors (DSPs). Each media functional unit 220 has an separate and individual sub-instruction stream, but all three media functional units 220 execute synchronously so that the subinstructions progress lock-step through pipeline stages.

The general functional unit 222 is a RISC processor capable of executing arithmetic logic unit (ALU) operations, loads and stores, branches, and various specialized and esoteric functions such as parallel power operations, reciprocal square root operations, and many others. The general functional unit 222 supports less common parallel operations such as the parallel reciprocal square root instruction.

The illustrative instruction cache 210 has a 16 Kbyte capacity and includes hardware support to maintain coherence, allowing dynamic optimizations through self-modifying code. Software is used to indicate that the instruction storage is being modified when modifications occur. The 16 K capacity is suitable for performing graphic loops, other multimedia tasks or processes, and general-purpose Java™ code. Coherency is maintained by hardware that supports write-through, non-allocating caching. Self-modifying code is supported through explicit use of "store-to-instruction-space" instructions store2i. Software uses the store2i instruction to maintain coherency with the instruction cache 210 so that the instruction caches 210 do not have to be snooped on every single store operation issued by the media processing unit 110.

The pipeline control unit 226 is connected between the instruction buffer 214 and the functional units and schedules the transfer of instructions to the functional units. The pipeline control unit 226 also receives status signals from the functional units and the load/store unit 218 and uses the status signals to perform several control functions. The pipeline control unit 226 maintains a scoreboard, generates stalls and bypass controls. The pipeline control unit 226 also generates traps and maintains special registers.

Each media processing unit 110 and 112 includes a split register file 216, a single logical register file including 128 thirty-two bit registers. The split register file 216 is split into a plurality of register file segments 224 to form a multi-ported structure that is replicated to reduce the integrated circuit die area and to reduce access time. A separate register file segment 224 is allocated to each of the media functional units 220 and the general functional unit 222. In the illustrative embodiment, each register file segment 224 has 128 32-bit registers. The first 96 registers (0–95) in the register file segment 224 are global registers. All functional units can write to the 96 global registers. The global registers are coherent across all functional units (MFU and GFU) so that any write operation to a global register by any functional unit is broadcast to all register file segments 224. Registers 96–127 in the register file segments 224 are local registers. Local registers allocated to a functional unit are not accessible or "visible" to other functional units.

The media processing units 110 and 112 are highly structured computation blocks that execute software-scheduled data computation operations with fixed, deterministic and relatively short instruction latencies, operational characteristics yielding simplification in both function and cycle time. The operational characteristics support multiple instruction issue through a pragmatic very large instruction word (VLIW) approach that avoids hardware interlocks to account for software that does not schedule operations properly. Such hardware interlocks are typically complex, error-prone, and create multiple critical paths. A VLIW instruction word always includes one instruction that executes in the general functional unit (GFU) 222 and from zero to three instructions that execute in the media functional units (MFU) 220. A MFU instruction field within the VLIW instruction word includes an operation code (opcode) field, three source register (or immediate) fields, and one destination register field.

Instructions are executed in-order in the processor 100 but loads can finish out-of-order with respect to other instructions and with respect to other loads, allowing loads to be moved up in the instruction stream so that data can be streamed from main memory. The execution model eliminates the usage and overhead resources of an instruction window, reservation stations, a re-order buffer, or other blocks for handling instruction ordering. Elimination of the instruction ordering structures and overhead resources is highly advantageous since the eliminated blocks typically consume a large portion of an integrated circuit die. For example, the eliminated blocks consume about 30% of the die area of a Pentium II processor.

To avoid software scheduling errors, the media processing units 110 and 112 are high-performance but simplified with respect to both compilation and execution. The media processing units 110 and 112 are most generally classified as a simple 2-scalar execution engine with full bypassing and hardware interlocks on load operations. The instructions include loads, stores, arithmetic and logic (ALU) instructions, and branch instructions so that scheduling for the processor 100 is essentially equivalent to scheduling for a simple 2-scalar execution engine for each of the two media processing units 110 and 112.

The processor 100 supports full bypasses between the first two execution units within the media processing unit 110 and 112 and has a scoreboard in the general functional unit 222 for load operations so that the compiler does not need to handle nondeterministic latencies due to cache misses. The processor 100 scoreboards long latency operations that are executed in the general functional unit 222, for example a reciprocal square-root operation, to simplify scheduling across execution units. The scoreboard (not shown) operates by tracking a record of an instruction packet or group from the time the instruction enters a functional unit until the instruction is finished and the result becomes available. A VLIW instruction packet contains one GFU instruction and from zero to three MFU instructions. The source and destination registers of all instructions in an incoming VLIW instruction packet are checked against the scoreboard. Any true dependencies or output dependencies stall the entire packet until the result is ready. Use of a scoreboarded result as an operand causes instruction issue to stall for a sufficient number of cycles to allow the result to become available. If the referencing instruction that provokes the stall executes on the general functional unit 222 or the first media functional unit 220, then the stall only endures until the result is available for intra-unit bypass. For the case of a load instruction that hits in the data cache 106, the stall may last only one cycle. If the referencing instruction is on the second or third media functional units 220, then the stall endures until the result reaches the writeback stage in the pipeline where the result is bypassed in transmission to the split register file 216.

The scoreboard automatically manages load delays that occur during a load hit. In an illustrative embodiment, all loads enter the scoreboard to simplify software scheduling and eliminate NOPs in the instruction stream.

The scoreboard is used to manage most interlocks between the general functional unit 222 and the media functional units 220. All loads and non-pipelined long-latency operations of the general functional unit 222 are scoreboarded. The long-latency operations include division idiv,fdiv instructions, reciprocal square root frecsqrt, precsqrt instructions, and power ppower instructions. None of the results of the media functional units 220 is scoreboarded. Non-scoreboarded results are available to subsequent operations on the functional unit that produces the results following the latency of the instruction.

The illustrative processor 100 has a rendering rate of over fifty million triangles per second without accounting for operating system overhead. Therefore, data feeding specifications of the processor 100 are far beyond the capabilities of cost-effective memory systems. Sufficient data bandwidth is achieved by rendering of compressed geometry using the geometry decompressor 104, an on-chip real-time geometry decompression engine. Data geometry is stored in main memory in a compressed format. At render time, the data geometry is fetched and decompressed in real-time on the integrated circuit of the processor 100. The geometry decompressor 104 advantageously saves memory space and memory transfer bandwidth. The compressed geometry uses an optimized generalized mesh structure that explicitly calls out most shared vertices between triangles, allowing the processor 100 to transform and light most vertices only once. In a typical compressed mesh, the triangle throughput of the transform-and-light stage is increased by a factor of four or more over the throughput for isolated triangles. For example, during processing of triangles, multiple vertices are operated upon in parallel so that the utilization rate of resources is high, achieving effective spatial software pipelining. Thus operations are overlapped in time by operating on several vertices simultaneously, rather than overlapping several loop iterations in time. For other types of applications with high instruction level parallelism, high trip count loops are software-pipelined so that most media functional units 220 are fully utilized.

Figure 3:
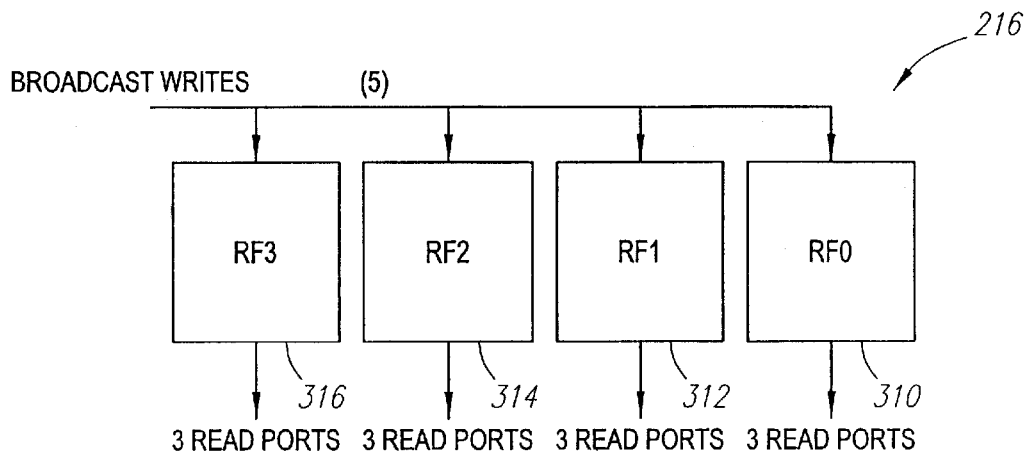
FIG. 3 is a schematic block diagram that illustrates an embodiment of the split register file that is suitable for usage in the processor.

Referring to FIG. 3, a schematic block diagram illustrates an embodiment of the split register file 216 that is suitable for usage in the processor 100. The split register file 216 supplies all operands of processor instructions that execute in the media functional units 220 and the general functional units 222 and receives results of the instruction execution from the execution units. The split register file 216 operates as an interface to the geometry decompressor 104. The split register file 216 is the source and destination of store and load operations, respectively.

In the illustrative processor 100, the split register file 216 in each of the media processing units 110 and 112 has 128 registers. Graphics processing places a heavy burden on register usage. Therefore, a large number of registers is supplied by the .split register file 216 so that performance is not limited by loads and stores or handling of intermediate results including graphics "fills" and "spills". The illustrative split register file 216 includes twelve read ports and five write ports, supplying total data read and write capacity between the central registers of the split register file 216 and all media functional units 220 and the general functional unit 222. The five write ports include one 64-bit write port that is dedicated to load operations. The remaining four write ports are 32 bits wide and are used to write operations of the general functional unit 222 and the media functional units 220.

Total read and write capacity promotes flexibility and facility in programming both of hand-coded routines and compiler-generated code.

Large, multiple-ported register files are typically metal-limited so that the register area is proportional with the square of the number of ports. A sixteen port file is roughly proportional in size and speed to a value of 256. The illustrative split register file 216 is divided into four register file segments 310, 312, 314, and 316, each having three read ports and four write ports so that each register file segment has a size and speed proportional to 49 for a total area for the four segments that is proportional to 196. The total area is therefore potentially smaller and faster than a single central register file. Write operations are fully broadcast so that all files are maintained coherent. Logically, the split register file 216 is no different from a single central register file. However, from the perspective of layout efficiency, the split register file 216 is highly advantageous, allowing for reduced size and improved performance.

The new media data that is operated upon by the processor 100 is typically heavily compressed. Data transfers are communicated in a compressed format from main memory and input/output devices to pins of the processor 100, subsequently decompressed on the integrated circuit holding the processor 100, and passed to the split register file 216.

Splitting the register file into multiple segments in the split register file 216 in combination with the character of data accesses in which multiple bytes are transferred to the plurality of execution units concurrently, results in a high utilization rate of the data supplied to the integrated circuit chip and effectively leads to a much higher data bandwidth than is supported on general-purpose processors. The highest data bandwidth requirement is therefore not between the input/output pins and the central processing units, but is rather between the decompressed data source and the remainder of the processor. For graphics processing, the highest data bandwidth requirement is between the geometry decompressor 104 and the split register file 216. For video decompression, the highest data bandwidth requirement is internal to the split register file 216. Data transfers between the geometry decompressor 104 and the split register file 216 and data transfers between various registers of the split register file 216 can be wide and run at processor speed, advantageously delivering a large bandwidth.

The register file 216 is a focal point for attaining the very large bandwidth of the processor 100. The processor 100 transfers data using a plurality of data transfer techniques. In one example of a data transfer technique, cacheable data is loaded into the split register file 216 through normal load operations at a low rate of up to eight bytes per cycle. In another example, streaming data is transferred to the split register file 216 through group load operations which transfer thirty-two bytes from memory directly into eight consecutive 32-bit registers. The processor 100 utilizes the streaming data operation to receive compressed video data for decompression.

Compressed graphics data is received via a direct memory access (DMA) unit in the geometry decompressor 104. The compressed graphics data is decompressed by the geometry decompressor 104 and loaded at a high bandwidth rate into the split register file 216 via group load operations that are mapped to the geometry decompressor 104.

Load operations are non-blocking and scoreboarded so that a long latency inherent to loads can be hidden by early scheduling.

General-purpose applications often fail to exploit the large register file 216. Statistical analysis shows that compilers do not effectively use the large number of registers in the split register file 216. However, aggressive in-lining techniques that have traditionally been restricted due to the limited number of registers in conventional systems may be advantageously used in the processor 100 to exploit the large number of registers in the split register file 216. In a software system that exploits the large number of registers in the processor 100, the complete set of registers is saved upon the event of a thread (context) switch. When only a few registers of the entire set of registers is used, saving all registers in the full thread switch is wasteful. Waste is avoided in the processor 100 by supporting individual marking of registers. Octants of the thirty-two registers can be marked as "dirty" if used, and are consequently saved conditionally. Register marking is discussed in more detail in U.S. patent application Ser. No. 09/204,586 entitled, "Efficient Handling of a Large Register File for Context Switching", naming as inventors Marc Tremblay and William Joy, which is filed on even date herewith and is hereby incorporated by reference in its entirety.

In various embodiments, the split register file 216 is leveraged by dedicating fields for globals, trap registers, and the like.

Figure 4:
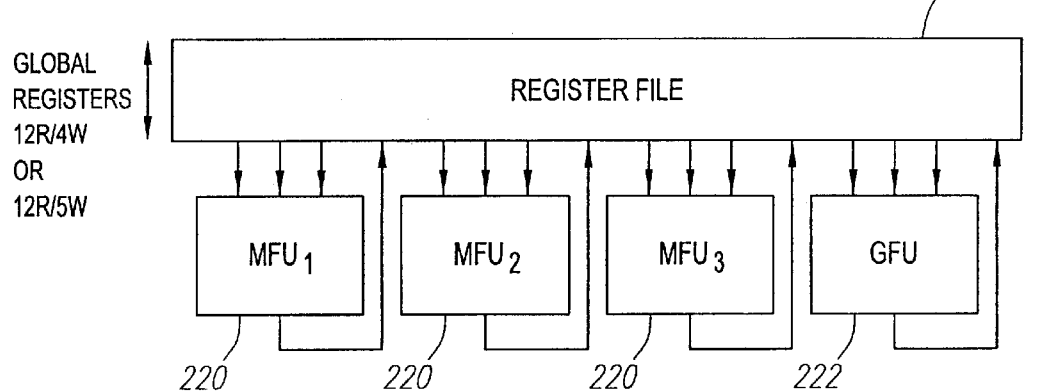
FIG. 4 is a schematic block diagram that shows a logical view of the register file and functional units in the processor.

Referring to FIG. 4, a schematic block diagram shows a logical view of the register file 216 and functional units in the processor 100. The physical implementation of the core processor 100 is simplified by replicating a single functional unit to form the three media functional units 220. The media functional units 220 include circuits that execute various arithmetic and logical operations including general-purpose code, graphics code, and video-image-speech (VIS) processing. VIS processing includes video processing, image processing, digital signal processing (DSP) loops, speech processing, and voice recognition algorithms, for example.

Figure 5:
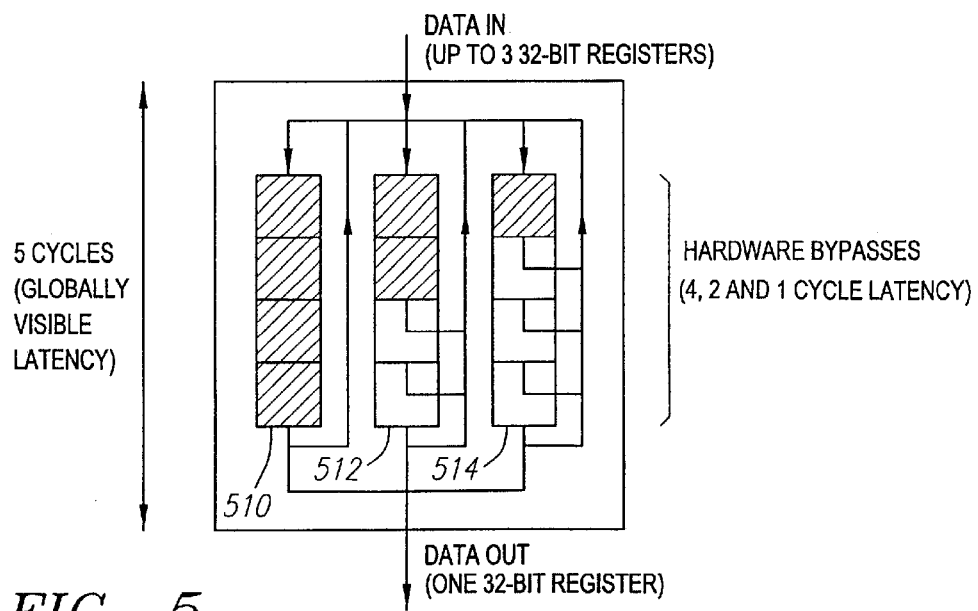
FIG. 5 is a pictorial schematic diagram depicting an example of instruction execution among a plurality of media functional units.

Referring to FIG. 5, a simplified pictorial schematic diagram depicts an example of instruction execution among a plurality of media functional units 220. Results generated by various internal function blocks within a first individual media functional unit are immediately accessible internally to the first media functional unit 510 but are only accessible globally by other media functional units 512 and 514 and by the general functional unit five cycles after the instruction enters the first media functional unit 510, regardless of the actual latency of the instruction. Therefore, instructions executing within a functional unit can be scheduled by software to execute immediately, taking into consideration the actual latency of the instruction. In contrast, software that schedules instructions executing in different functional units is expected to account for the five cycle latency. In the diagram, the shaded areas represent the stage at which the pipeline completes execution of an instruction and generates final result values. A result is not available internal to a functional unit a final shaded stage completes. In the example, media processing unit instructions have three different latencies—four cycles for instructions such as fmuladd and fadd, two cycles for instructions such as pmuladd, and one cycle for instructions like padd and xor.

Although internal bypass logic within a media functional unit 220 forwards results to execution units within the same media functional unit 220, the internal bypass logic does not detect incorrect attempts to reference a result before the result is available.

Software that schedules instructions for which a dependency occurs between a particular media functional unit, for example 512, and other media functional units 510 and 514, or between the particular media functional unit 512 and the general functional unit 222, is to account for the five cycle latency between entry of an instruction to the media functional unit 512 and the five cycle pipeline duration.

Figure 6:
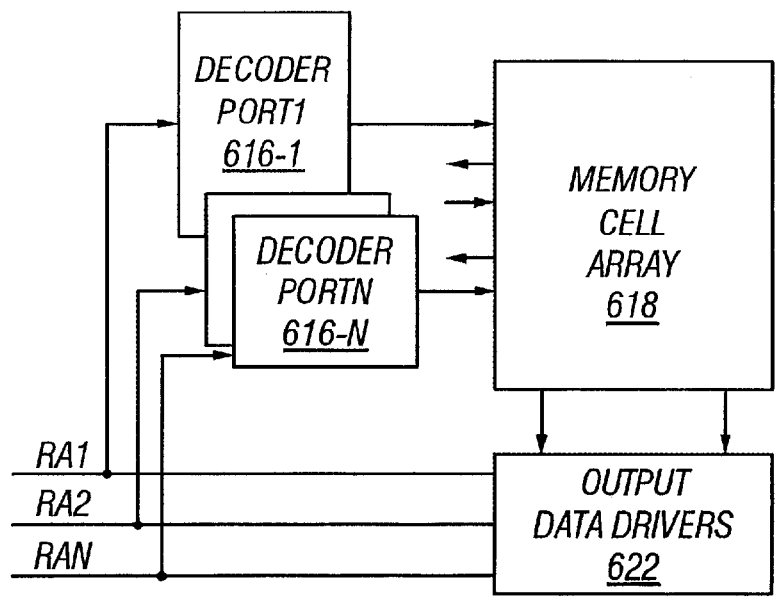
FIG. 6 illustrates a schematic block diagram of an SRAM array used for the multi-port split register file.

Referring to FIG. 6, a schematic block diagram depicts an embodiment of the multiport register file 216. A plurality of read address buses RA1 through RAN carry read addresses that are applied to decoder ports 6161 through 616-N, respectively. Decoder circuits are well known to those of ordinary skill in the art, and any of several implementations could be used as the decoder ports 616-1 through 616-N. When an address is presented to any of decoder ports 616-1 through 616-N, the address is decoded and a read address signal is transmitted by a decoder port 616 to a register in a memory cell array 618. Data from the memory cell array 618 is output using output data drivers 622. Data is transferred to and from the memory cell array 618 under control of control signals carried on some bus lines of the plurality of the plurality of read address buses RA1 through RAN.

Figure 7A:
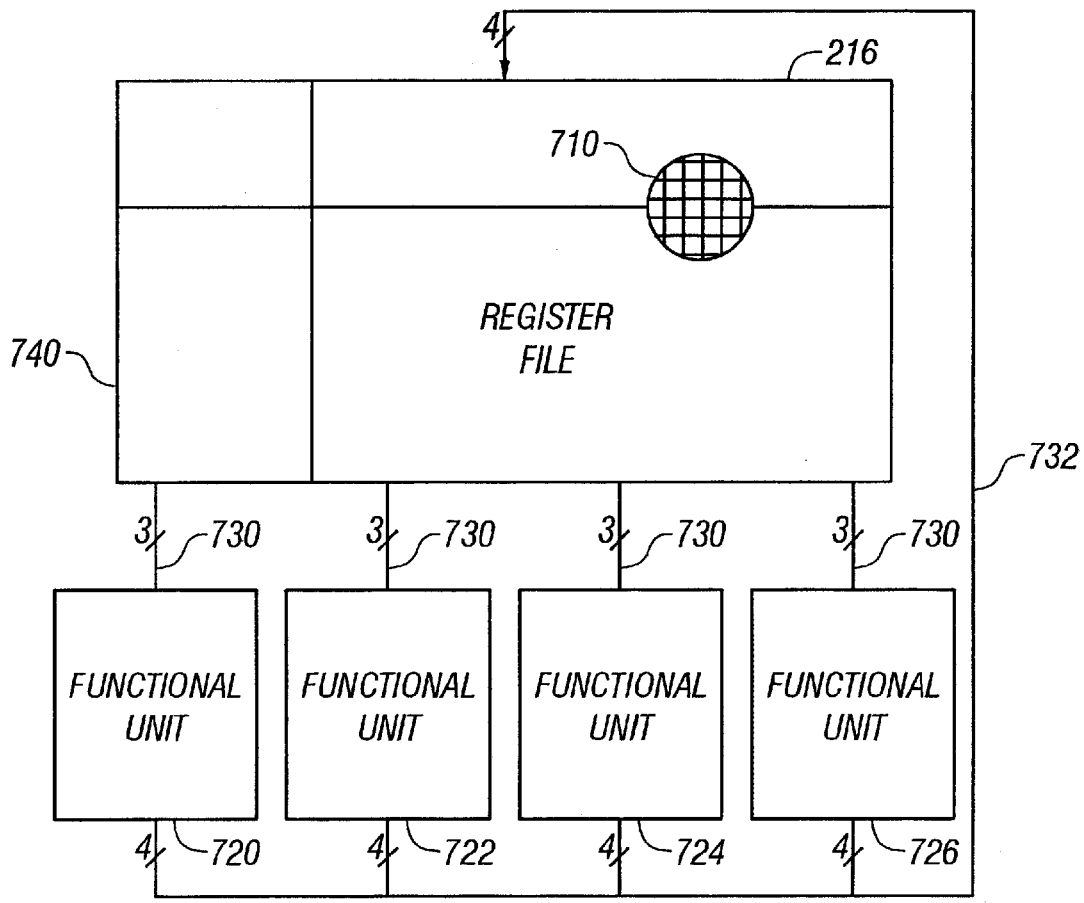
FIGS. 7A and 7B are, respectively, a schematic block diagram and a pictorial diagram that illustrate the register file and a memory array insert of the register file.
Figure 7B:
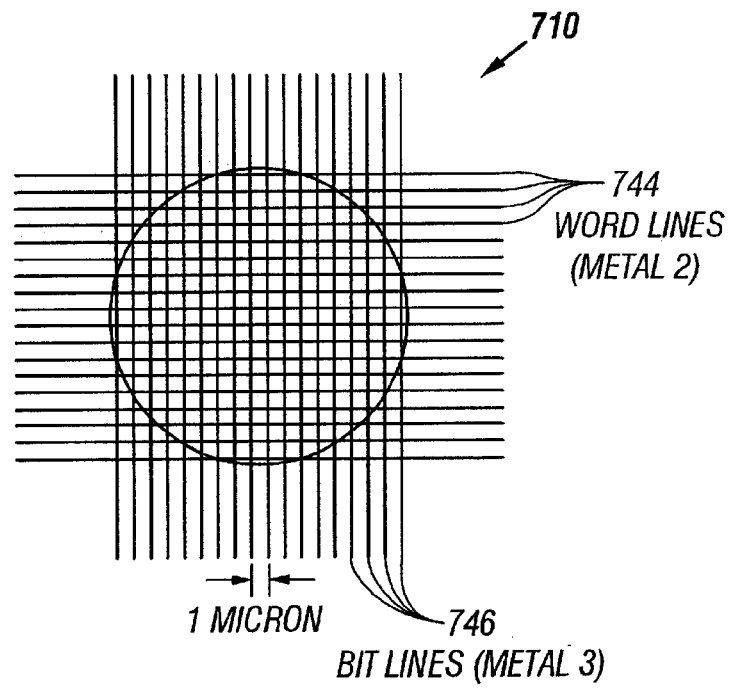

Referring to FIGS. 7A and 7B, a schematic block diagram and a pictorial diagram, respectively, illustrate the register file 216 and a memory array insert 710. The register file 216 is connected to a four functional units 720, 722, 724, and 726 that supply information for performing operations such as arithmetic, logical, graphics, data handling operations and the like. The illustrative register file 216 has twelve read ports 730 and four write ports 732. The twelve read ports 730 are illustratively allocated with three ports connected to each of the four functional units. The four write ports 732 are connected to receive data from all of the four functional units.

The register file 216 includes a decoder, as is shown in FIG. 6, for each of the sixteen read and write ports. The register file 216 includes a memory array 740 that is partially shown in the insert 710 illustrated in FIG. 7B and includes a plurality of word lines 744 and bit lines 746. The word lines 744 and bit lines 746 are simply a set of wires that connect transistors (not shown) within the memory array 740. The word lines 744 select registers so that a particular word line selects a register of the register file 216. The bit lines 746 are a second set of wires that connect the transistors in the memory array 740. Typically, the word lines 744 and bit lines 746 are laid out at right angles. In the illustrative embodiment, the word lines 744 and the bit lines 746 are constructed of metal laid out in different planes such as a metal 2 layer for the word lines 744 and a metal 3 layer for the bit lines 746. In other embodiments, bit lines and word lines may be constructed of other materials, such as polysilicon, or can reside at different levels than are described in the illustrative embodiment, that are known in the art of semiconductor manufacture. In the illustrative example, the word lines 744 are separated by a distance of about 1 $\mu$m and the bit lines 746 are separated by approximately 1 $\mu$m. Other circuit dimensions may be constructed for various processes. The illustrative example shows one bit line per port, other embodiments may use multiple bit lines per port.

When a particular functional unit reads a particular register in the register file 216, the functional unit sends an address signal via the read ports 730 that activates the appropriate word lines to access the register. In a register file having a conventional structure and twelve read ports, each cell, each storing a single bit of information, is connected to twelve word lines to select an address and twelve bit lines to carry data read from the address.

The four write ports 732 address registers in the register file using four word lines 744 and four bit lines 746 connected to each cell. The four word lines 744 address a cell and the four bit lines 746 carry data to the cell.

Thus, if the illustrative register file 216 were laid out in a conventional manner with twelve read ports 730 and four write ports 732 for a total of sixteen ports and the ports were 1 $\mu$m apart, one memory cell would have an integrated circuit area of 256 $\mu$m$^2$ (16×16). The area is proportional to the square of the number of ports.

The register file 216 is alternatively implemented to perform single-ended reads and/or single-ended writes utilizing a single bit line per port per cell, or implemented to perform differential reads and/or differential writes using two bit lines per port per cell.

Figure 8:
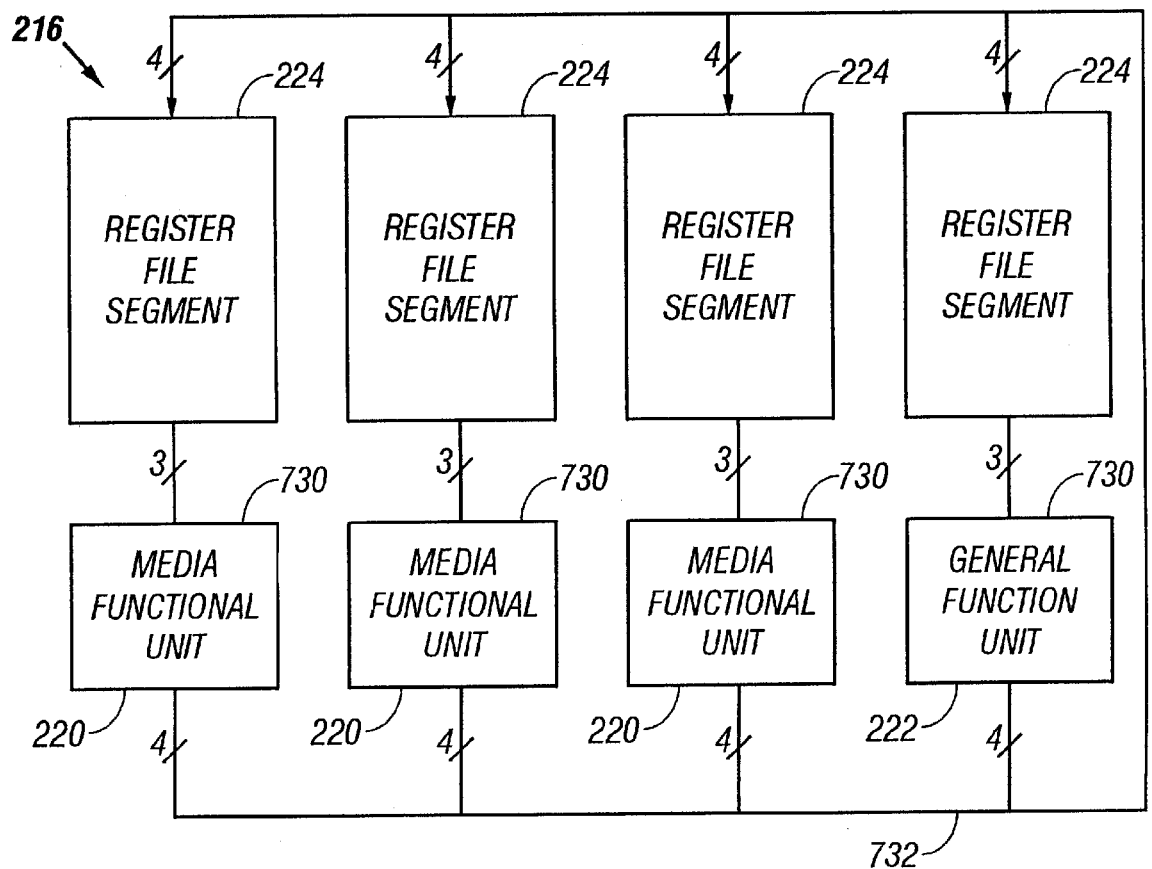
FIG. 8 is a schematic block diagram showing an arrangement of the register file into the four register file segments.

However, in this embodiment the register file 216 is not laid out in the conventional manner and instead is split into a plurality of separate and individual register file segments 224. Referring to FIG. 8, a schematic block diagram shows an arrangement of the register file 216 into the four register file segments 224. The register file 216 remains operational as a single logical register file in the sense that the four of the register file segments 224 contain the same number of registers and the same register values as a conventional register file of the same capacity that is not split. The separated register file segments 224 differ from a register file that is not split through elimination of lines that would otherwise connect ports to the memory cells. Accordingly, each register file segment 224 has connections to only three of the twelve read ports 730, lines connecting a register file segment to the other nine read ports are eliminated. All writes are broadcast so that each of the four register file segments 224 has connections to all four write ports 732. Thus each of the four register file segments 224 has three read ports and four write ports for a total of seven ports. The individual cells are connected to seven word lines and seven bit lines so that a memory array with a spacing of 1 $\mu$m between lines has an area of approximately 49 $\mu$m$_2$. In the illustrative embodiment, the four register file segments 224 have an area proportion to seven squared. The total area of the four register file segments 224 is therefore proportional to 49 times 4, a total of 196.

The split register file thus advantageously reduces the area of the memory array by a ratio of approximately 256/196 (1.3× or 30%). The reduction in area further advantageously corresponds to an improvement in speed performance due to a reduction in the length of the word lines 744 and the bit lines 746 connecting the array cells that reduces the time for a signal to pass on the lines. The improvement in speed performance is highly advantageous due to strict time budgets that are imposed by the specification of high-performance processors and also to attain a large capacity register file that is operational at high speed. For example, the operation of reading the register file 216 typically takes place in a single clock cycle. For a processor that executes at 500 MHz, a cycle time of two nanoseconds is imposed for accessing the register file 216. Conventional register files typically only have up to about 32 registers in comparison to the 128 registers in the illustrative register file 216 of the processor 100. A register file 216 that is substantially larger than the register file in conventional processors is highly advantageous in high-performance operations such as video and graphic processing. The reduced size of the register file 216 is highly useful for complying with time budgets in a large capacity register file.

Figure 9:
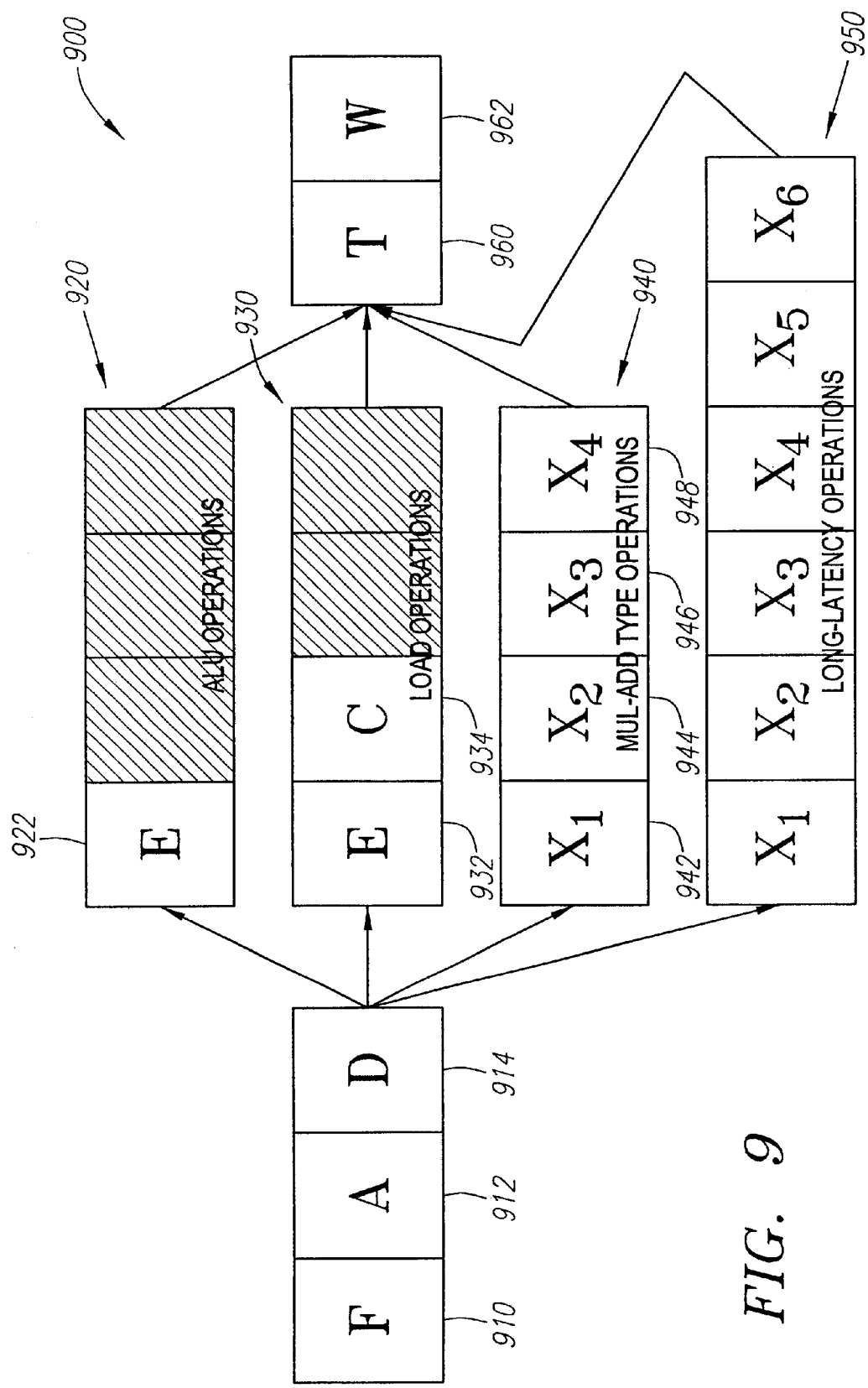
FIG. 9 is a schematic timing diagram that illustrates timing of the processor pipeline.

Referring to FIG. 9, a simplified schematic timing diagram illustrates timing of the processor pipeline 900. The pipeline 900 includes nine stages including three initiating stages, a plurality of execution phases, and two terminating stages. The three initiating stages are optimized to include only those operations necessary for decoding instructions so that jump and call instructions, which are pervasive in the Java™ language, execute quickly. Optimization of the initiating stages advantageously facilitates branch prediction since branches, jumps, and calls execute quickly and do not introduce many bubbles.

The first of the initiating stages is a fetch stage 910 during which the processor 100 fetches instructions from the 16 Kbyte two-way set-associative instruction cache 210. The fetched instructions are aligned in the instruction aligner 212 and forwarded to the instruction buffer 214 in an align stage 912, a second stage of the initiating stages. The aligning operation properly positions the instructions for storage in a particular segment of the four register file segments 310, 312, 314, and 316 and for execution in an associated functional unit of the three media functional units 220 and one general functional unit 222. In a third stage, a decoding stage 914 of the initiating stages, the fetched and aligned VLIW instruction packet is decoded and the scoreboard (not shown) is read and updated in parallel. The four register file segments 310, 312, 314, and 316 each holds either floating-point data or integer data. The register files are read in the decoding (D) stage.

Following the decoding stage 914, the execution stages are performed. The two terminating stages include a trap-handling stage 960 and a write-back stage 962 during which result data is written-back to the split register file 216.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims. For example, although the illustrative register file has one bit line per port, in other embodiments more bit lines may be allocated for a port. The described word lines and bit lines are formed of a metal. In other examples, other conductive materials such as doped polysilicon may be employed for interconnects. The described register file uses single-ended reads and writes so that a single bit line is employed per bit and per port. In other processors, differential reads and writes with dual-ended sense amplifiers may be used so that two bit lines are allocated per bit and per port, resulting in a bigger pitch. Dual-ended sense amplifiers improve memory fidelity but greatly increase the size of a memory array, imposing a heavy burden on speed performance. Thus the advantages attained by the described register file structure are magnified for a memory using differential reads and writes. The spacing between bit lines and word lines is described to be approximately 1 $\mu$m. In some processors, the spacing may be greater than 1 $\mu$m. In other processors the spacing between lines is less than 1 $\mu$m.

What is claimed is:

1. A storage array structure comprising:
   a plurality of separate and independent storage array storages;
   a plurality R of read ports coupled to the storage array storages for read access; and
   a plurality W of write ports coupled to the storage array storages for write access,
   the separate and independent storage array storages individually being coupled for access by a subset of the R read ports so that the individual read ports are coupled for accessing a single storage array storage; and
   the separate and independent storage array storages individually being coupled for write access by all W write ports.

2. A storage array structure according to claim 1 wherein:
   the storage array structure is a seventeen port structure with twelve read ports and five write ports; and
   the plurality of storage array storage s includes four storage array storages each having three read ports and five write ports.

3. A storage array structure according to claim 1 wherein:
   the storage array structure is a sixteen port structure with twelve read ports and four write ports; and
   the plurality of storage array storages includes four storage array storages each having three read ports and four write ports.

4. A storage array structure according to claim 1 wherein:
   write operations via the W write ports are fully broadcast so that all of the storage array storages are held coherent.

5. A storage array structure according to claim 1 wherein:
   the storage array structure includes storage for 128 or more registers.

6. A storage array structure according to claim 1 wherein:
   storage array storages include single-ended sense amplifiers.

7. A storage array structure according to claim 1 wherein:
   storage array storages include dual-ended sense amplifiers.

8. A storage array structure according to claim 1 wherein:
   storage array storages include storage cells having a plurality of word lines and a plurality of bit lines, the word lines being formed in one metal interconnect layer, the bits lines being formed in a second metal interconnect layer.

9. A register file structure comprising:
a plurality of separate and independent register file storages;
a plurality R of read ports coupled to the register file storages for read access; and
a plurality W of write ports coupled to the register file storages for write access,
   the separate and independent register file storages individually being coupled for access by a subset of the R read ports so that the individual read ports are coupled for accessing a single register file storage; and
   the separate and independent register file storages individually being coupled for write access by all W write ports.

10. A register file structure according to claim 9 wherein:
the register file structure is a seventeen port structure with twelve read ports and five write ports; and
the plurality of register file storages includes four register file storages each having three read ports and five write ports.

11. A register file structure according to claim 9 wherein:
the register file structure is a sixteen port structure with twelve read ports and four write ports; and
the plurality of register file storages includes four register file storages each having three read ports and four write ports.

12. A register file structure according to claim 9 wherein:
write operations via the W write ports are fully broadcast so that all of the register file storages are held coherent.

13. A register file structure according to claim 9 wherein:
the register file structure includes storage for 128 or more registers.

14. A register file structure according to claim 9 wherein:
register file include single-ended sense amplifiers.

15. A register file structure according to claim 9 wherein:
register file storages include dual-ended sense amplifiers.

16. A register file structure according to claim 9 wherein:
register file storages include storage cells having a plurality of word lines and a plurality of bit lines, the word lines being formed in one metal interconnect layer, the bits lines being formed in a second metal interconnect layer.

17. A processor comprising:
an instruction supplying circuit;
a plurality of functional units; and
a register file structure coupled to the instruction supplying circuit and coupled to the plurality of functional units, the register file structure including:
   a plurality of separate and independent register file storages;
   a plurality R of read ports coupled to the register file storages for read access; and
   a plurality W of write ports coupled to the register file storages for write access,
      the separate and independent register file storages individually being coupled for access by a subset of the R read ports so that the individual read ports are coupled for accessing a single register file storage; and
      the separate and independent register file storages individually being coupled for write access by all W write ports.

18. A processor according to claim 17 wherein:
the instruction supplying circuits include:
   an instruction cache;
   an instruction aligner coupled to the instruction cache; and
   an instruction buffer coupled to the instruction aligner.

19. A processor according to claim 17 wherein:
the register file structure is a seventeen port structure with twelve read ports and five write ports; and
the plurality of register file storages includes four register file storages each having three read ports and five write ports.

20. A processor according to claim 17 wherein:
the register file structure is a sixteen port structure with twelve read ports and four write ports; and
the plurality of register file storages includes four register file storages each having three read ports and four write ports.

21. A processor according to claim 17 wherein:
write operations via the W write ports are fully broadcast so that all of the register file storages are held coherent.

22. A processor according to claim 17 wherein:
the register file structure includes storage for 128 or more registers.

23. A processor according to claim 17 wherein:
register file include single-ended sense amplifiers.

24. A processor according to claim 17 wherein:
register file storages include dual-ended sense amplifiers.

25. A processor according to claim 17 wherein:
register file storages include storage cells having a plurality of word lines and a plurality of bit lines, the word lines being formed in one metal interconnect layer, the bits lines being formed in a second metal interconnect layer.

26. A method of forming a storage array structure having R read ports and W write ports comprising:
providing a storage array structure divided into a plurality of separate and independent storage array storages;
providing a plurality R of read ports coupled to the storage array storages for read access, and a plurality W of write ports coupled to the storage array storages for write access,
allocating a subset of the R read ports to the individual storage array storages so that the individual read ports are coupled for accessing a single storage array storage; and
connecting the W write ports to all storage array storages.

27. A method according to claim 26 further comprising:
providing the storage array structure as a seventeen port structure with twelve read ports and five write ports;
the storage array structure being divided into four storage array storages each having three read ports and five write ports.

28. A method according to claim 26 further comprising:
providing the storage array structure as a sixteen port structure with twelve read ports and four write ports;
the storage array structure being divided into four storage array storages each having three read ports and four write ports.

29. A storage array structure according to claim 1 further comprising:
a plurality of output data drivers coupled to the plurality of storage array storages, the output data drivers being coupled to a plurality of functional units in a configuration so that each of the individual storage array storages is coupled to an individual functional unit so that the functional unit accesses data from only a single storage array storage.

30. A register file structure according to claim 9 further comprising:

a plurality of output data drivers coupled to the plurality of register file storages, the output data drivers being coupled to a plurality of functional units in a configuration so that each of the individual register file storages is coupled to an individual functional unit so that the functional unit accesses data from only a single register file storage.

31. A processor according to claim 17 further comprising:

a plurality of output data drivers coupled to the plurality of register file storages, the output data drivers being coupled to a plurality of functional units in a configuration so that each of the individual register file storages is coupled to an individual functional unit so that the functional unit accesses data from only a single register file storage.

* * * * *